(12) United States Patent
Matick et al.

(10) Patent No.: US 7,289,369 B2
(45) Date of Patent: Oct. 30, 2007

(54) DRAM HIERARCHICAL DATA PATH

(75) Inventors: Richard E. Matick, Cortlandt Manor, NY (US); Stanley E. Schuster, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/108,369

(22) Filed: Apr. 18, 2005

(65) Prior Publication Data

US 2006/0233024 A1   Oct. 19, 2006

(51) Int. Cl.
G11C 7/10 (2006.01)
(52) U.S. Cl. .............................. 365/189.01; 365/189.06
(58) Field of Classification Search ................ 365/149, 365/189.01, 189.06
See application file for complete search history.

(56) References Cited

U.S. PATENT DOCUMENTS

| | | | | |
|---|---|---|---|---|
| 5,353,255 A | * | 10/1994 | Komuro | 365/208 |
| 5,675,529 A | * | 10/1997 | Poole | 365/63 |
| 5,732,026 A | * | 3/1998 | Sugibayashi et al. | 365/189.05 |
| 5,978,255 A | * | 11/1999 | Naritake | 365/149 |
| 5,986,914 A | * | 11/1999 | McClure | 365/63 |
| 5,995,403 A | * | 11/1999 | Naritake | 365/63 |
| 6,141,259 A | * | 10/2000 | Scott et al. | 365/189.06 |
| 6,636,454 B2 | * | 10/2003 | Fujino et al. | 365/230.08 |
| 2004/0243758 A1 | * | 12/2004 | Notani | 711/1 |

* cited by examiner

*Primary Examiner*—Richard T. Elms
*Assistant Examiner*—Douglas King
(74) *Attorney, Agent, or Firm*—Law Office of Charles W. Peterson, Jr.; Satheesh K. Karra, Esq.; Rafael Perez-Pineiro, Esq.

(57) ABSTRACT

A hierarchical DRAM array, DRAM macro and logic chip including the DRAM macro embedded in the logic. DRAM array columns are segmented with a small number (e.g., 2-64) of cells connected to a local bit line (LBL) in each segment. Each LBL drives a sense device that drives a global read bit line (GRBL). When a cell storing a high is selected, the cell drives the LBL high, which turns the sense device on to drive the GRBL low. Segments may be used individually (as a macro) or combined with other segments sharing a common GRBL.

19 Claims, 6 Drawing Sheets

DRAM HIERARCHICAL DATA PATH

FIELD OF THE INVENTION

The present invention is related to improving dynamic random access memory (DRAM) and more particularly to a DRAM architecture for including DRAM macros on integrated circuit (IC) chips.

BACKGROUND DESCRIPTION

Random access memories (RAMs) are well known in the art. A typical RAM has a memory array wherein every location is addressable and freely accessible by providing the correct corresponding address. Dynamic RAMs (DRAMs) are dense RAMs with a very small memory cell. High performance Static RAMs (SRAMs) are somewhat less dense (and generally more expensive per bit) than DRAMs, but expend more power in each access to achieve speed, i.e., provide better access times than DRAMs at the cost of higher power. In a typical data processing system, the bulk of the memory is DRAM in main memory with faster SRAM in cache memory, closer to the processor or microprocessor. Caching is an effective technique for increasing microprocessor performance. RAMs are commonly made in the well-known complementary insulated gate field effect transistor (FET) technology known as CMOS.

A typical CMOS logic circuit, for example, includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a resistor (R) in series with the closed switch), the other device (the PFET) is off, not conducting (ideally modeled as an open switch) and, vice versa. For example, a CMOS inverter is a series connected PFET and NFET pair that are connected between a power supply voltage (Vdd) and ground (GND). A typical static random access memory (SRAM) cell, ideally includes a balanced pair of cross-coupled inverters storing a single data bit with a high at the output of one inverter and a low at the output of the other. A pair of pass gates (also ideally, a balanced pair of FETs) selectively connects the complementary outputs of the cross-coupled inverter to a corresponding complementary pair of bit lines. A word line connected to the gates of the pass gate FETs selects connecting the cell to the corresponding complementary pair of bit lines. During a cell access, the pass gates are turned on to couple the bit line contents to the cross-coupled inverters. In a well designed SRAM, once data is stored in a cell and unless power is lost, the cell maintains that data until it is overwritten.

A DRAM cell is essentially a capacitor for storing charge and a switch, a pass transistor (also called a pass gate or access transistor) that switches on and off to transfer charge to and from the capacitor. Thus, a typical DRAM cell is much smaller (denser) than a typical SRAM cell, e.g., <¼. Data (1 bit) stored in the cell is determined by the absence or presence of charge on the storage capacitor. Since each cell has numerous leakage paths from the storage capacitor, unless it is periodically refreshed, charge stored on the storage capacitor eventually leaks off. Each DRAM cell is read by coupling the cell's storage capacitor (through the access transistor) to a bit line, which is a larger capacitance, and measuring the resulting voltage difference on the bit line. Since each time a cell is read, the voltage on the storage capacitor is equalized with the voltage on the bit line, the cell's contents are destroyed by the read, i.e., a destructive read.

As is further well known in the art, the maximum voltage that an FET pass gate will pass is its gate to source voltage ($V_{gs}$) reduced by the FET turn-on or threshold voltage ($V_T$), i.e., the stored voltage ($V_{St}$) on the storage capacitor ($C_{cell}$) is $V_{St}=V_{gs}-V_T$. The magnitude of the signal ($V_{sig}$) transferred to the bit line with capacitance $C_{BL}$ is $V_{sig}=C_{cell}V_{St}/(C_{cell}+C_{BL})$. In a typical state of the art DRAM (e.g., 256 Mbit or 1 Gbit) with up to 512 or even 1024 bits on each bit line, $C_{BL}$ is at least one order of magnitude larger than $C_{cell}$. So, $V_{sig}$ is typically at least an order of magnitude smaller than the supply voltage, $V_{dd}$, and is, typically, a few hundred millivolts (mv). Further, that signal develops exponentially with a time constant dependent upon the overall RC time constant of the signal path, i.e., where R includes the FET on resistance and $C=C_{cell}+C_{BL}$. Thus, developing a sufficient bit line signal to sense, i.e. to transfer a portion of $V_{St}$ to the bit line, typically accounts for most of the read time of a state of the art DRAM.

Unfortunately, DRAM read time has been much longer than SRAM read time, e.g., an order of magnitude. Consequently, this longer read time has been a significant deterrent to using DRAM in high performance logic chips and the primary reason less dense but faster SRAM is used for cache memory.

Thus, there is a need for high performance DRAMs, especially with reduced cell read times and more particularly, for high performance DRAMs suitable for embedded use in logic chips.

SUMMARY OF THE INVENTION

It is a purpose of the invention to improve DRAM access time;

It is another purpose of the invention to simplify DRAM operation;

It is yet another purpose of the invention to simplify DRAM data sensing;

It is yet another purpose of the invention to simplify refreshing DRAM cell contents;

It is yet another purpose of the invention to simplify DRAM data sensing and refresh, reducing active DRAM power;

It is yet another purpose of the invention to facilitate embedding DRAM in logic chips.

The present invention relates to a hierarchical DRAM array, DRAM macro and logic chip including the DRAM macro embedded in the logic. DRAM array columns are segmented with a small number (e.g., 2-64) of cells connected to a local bit line (LBL) in each segment. Each LBL drives a sense device that drives a global read bit line (GRBL). When a cell storing a higher voltage (~1V) is selected, the cell drives the LBL high, which turns the sense device on to drive the GRBL low. Segments may be used individually (as a macro) or combined with other segments sharing a common GRBL.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
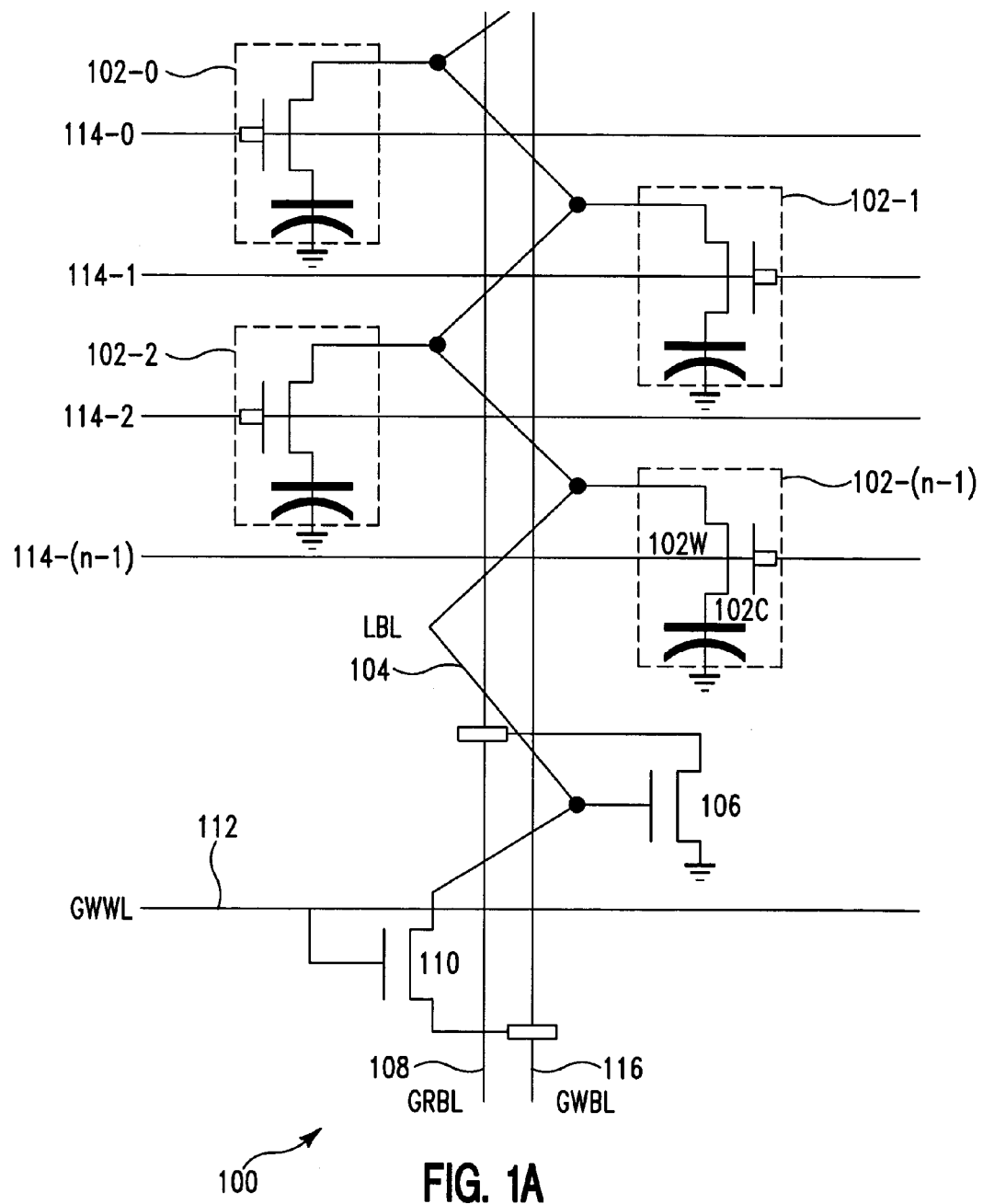
FIGS. 1A-B show a cross sectional example of a preferred hierarchical-data-path DRAM organized for low local bit line capacitance, according to the present invention.
Figure 1B:
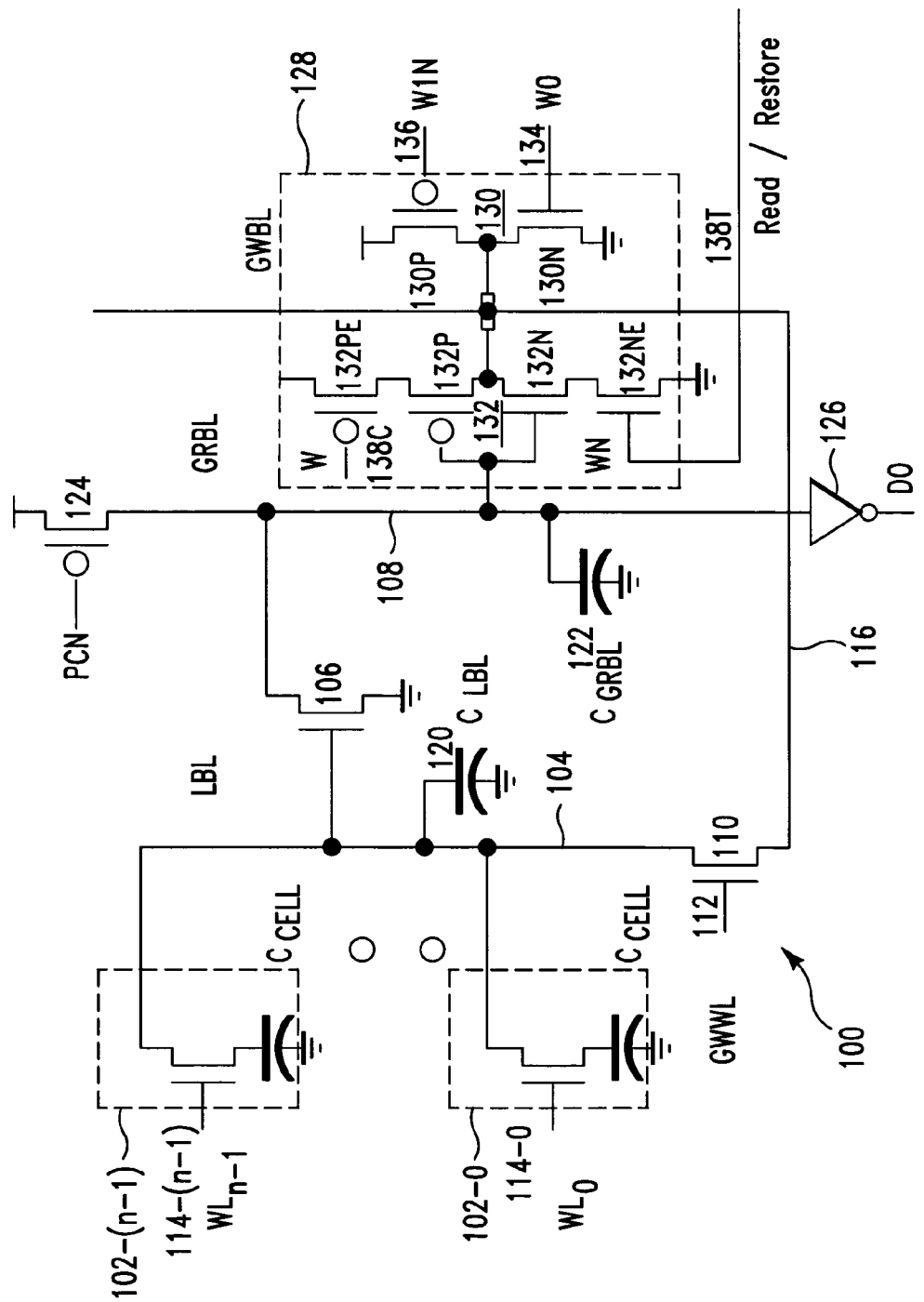

Turning now to the drawings and, more particularly, FIGS. 1A-B show a cross sectional example of a preferred hierarchical-data-path DRAM 100 organized for low local bit line capacitance, according to the present invention. Preferably, the DRAM 100 is formed in the insulated gate technology known as CMOS. In this example, although described hereinbelow as a segment, the hierarchical-data-path DRAM 100 may be a single stand alone n bit DRAM macro, one of M columns in an n by Mbit DRAM macro, a segment in a much larger DRAM macro or chip or, any combination thereof.

FIG. 1A shows a column segment 100 of n (where n is shown as 4 in this example) cells 102-0, 102-1, . . . , 102-(n-1), connected to a Local Bit Line (LBL) 104, a representative sense/read device 106 connected to a Global Read Bit Line (GRBL) 108 and write device 110 gated by one of N Global Write Word Lines (GWWL) 112.

Preferably, n is between 2 and 64 but can have any value. So, in this representative cross-section, each column includes N*n cells, where for a 1024 bit column with n=4 or 8 bits per segment, N is 256 or 128 respectively. Each cell includes a storage capacitor ($C_{CELL}$) 102C and a pass gate 102W, an NFET in this example. Each pass gate 102W is gated by a respective word line 114-0, 114-1, . . . , 114-(n-1). Preferably, each word line 114-0, 114-1, . . . , 114-(n-1) is driven above a cell supply voltage (e.g., at least to $V_{dd}+V_T$) to maximize the charge transferred to/from the storage capacitor 102C in a selected cell. The LBL 104 gates the sense/read device 106, which is also an NFET in this example. The sense/read device 106 is connected drain to source between the GRBL 108 and ground. The write device 110, also an NFET in this example, is connected drain to source between the LBL 104 and a Global Write Bit Line (GWBL) 116. Cells 102-0, 102-1, . . . , 102-(n-1), are written by placing high or low on the GWBL 116 and a high voltage on respective GWWL 112 to couple that high/low to LBL 104; and coincidentally or shortly thereafter, pulling high one word line 114-0, 114-1, . . . , 114-(n-1) to transfer that high/low from the GBWL 116 to the storage capacitor 102C in a selected cell 102-0, 102-1, . . . , 102-(n-1).

A read cycle begins with all of the word lines 114-0, 114-1, . . . , 114-(n-1) at a low voltage, e.g., zero volts (0.0V) or ground. Initially the local bit line 104 is discharged/pre-charged to ground; the GRBL 108 is pre-charged and floating at a high voltage (~1V); and, the GWBL 116 is at a low voltage. When a selected one of the word lines 114-0, 114-1, . . . , 114-(n-1) is driven high, storage capacitors 102C in cells on that selected word line, e.g., 114-(n-1), are coupled to a respective LBL 104. If the respective storage capacitor 102C is storing a "0," the GRBL 108 remains high and the GWBL 116 remains low. However, if the respective selected cell's storage capacitor 102C stores a "1" and thus is charged high, a small portion of that charge (as described in more detail hereinbelow) quickly transfers to the respective LBL 104, pulling that LBL 104 high. With the LBL 104 high, sense/read device 106 turns on to pull the floating GRBL 108 low. Although each segment 100 requires a small number of additional devices 106, 110 for reading and writing, these extra segment devices have little impact on cell density. Thus, for this minor area penalty (i.e., for these additional devices 106, 110) by combining a lightly loaded LBL 104 driving a sense/read device 106 connected to and driving a more heavily loaded GRBL 108 a preferred embodiment DRAM array achieves fast, accurate sensing; while maintaining a separate GWBL 116 insures fast restore and writing.

FIG. 1B shows the same column segment 100 in further detail schematically representing inherent local bit line capacitance ($C_{LBL}$) 120 and global read bit line capacitance ($C_{GRBL}$) 122. $C_{LBL}$ 120 represents the cumulative capacitance for the LBL 104 including diffusion capacitance at the drains of cell pass gates, wiring capacitance connecting the cells together, the gate capacitance of respective sense/read devices 106 and any remaining parasitic capacitance. Thus, preferably, n is selected such that $C_{LBL}$ 120 is smaller than $C_{CELL}$ (102C in FIG. 1A) and most preferably, $C_{LBL}$ 120 is much smaller than $C_{CELL}$. This example also shows a standby pre-charge device 124, an output driver 126, (e.g., an inverter or a high impedance driver) and a Write/Restore circuit 128.

So, $C_{GRBL}$ 122 represents the cumulative diffusion capacitance of the drains of sense/read devices 106, global wiring capacitance connecting the sense/read devices 106 together, the gate capacitance of a respective column input/output (I/O) circuit (Write/Restore circuit 128 and output driver 126 in this example) and any remaining parasitic and wiring capacitance.

The Write/Restore circuit 128 of this example includes a write driver 130 and a restore circuit 132, each selectively driving the respective GWBL 116. The write driver 130 includes individually driven NFET 130N and PFET 130P gated by pair of individual data write signals 134, 136. The restore circuit 132 includes a complementary NFET 132N, PFET 132P inverter pair that are series connected between an enable NFET 132NE and an enable PFET 132PE. The enable NFET 132NE and PFET 132PE are selectively driven by a pair of complementary refresh enable signals 138T, 138C. The restore circuit 132 is enabled for all read accesses except when the write driver 130 is driving data onto the GWBL 116.

The write driver 130 is off except during a write. So, during a read-restore cycle, data write signal 134 is low and data write signal 136 is high. During a write, one of the respective data write signals 134, 136 is switched high or low to drive the respective GWBL 116. Shortly thereafter, the respective GWWL 112 is driven high to pass the incoming data value to the respective selected cell 102-0, . . . , 102-(n-1). Then, the write driver 130 is returned to its high impedance state the respective word line 114-0, . . . , 114-(n-1) drops to isolate the cell from the LBL, storing data in memory.

Typically, prior to a read with all of the word lines 114-0-114-(n-1) low, the GRBL 108 is precharged high, e.g., by standby/pre-charge device 124, which charges $C_{GRBL}$ 122 and the LBL 104 is discharged/pre-charged low (e.g., through write device 110 and write-restore circuit 128). This also causes the output driver 126 to drive a low. Thereafter, the precharged device 124 is turned off and the respective GWWL 112 is pulled low turning off write device 110; and as noted hereinabove, one of the word lines 114-0, . . . , 114-(n-1) is driven high. Storage capacitors in cells on that word line, e.g., 114(n-1), are coupled to a respective LBL 104. Again, if the respective storage capacitor 102C is at low voltage, no charge transfers to $C_{LBL}$ 120 and, the GRBL 108 remains high. However, if the respective storage capacitor is charged high, that charge is coupled to $C_{LBL}$ 120 and LBL 104, pulling it high. When the voltage across $C_{LBL}$ 120 rises above the $V_T$ of sense/read device 106, the sense/read device 106 turns on pulling GRBL 108 and CGRBL 122 low. So in this example, a single FET 110 in combination with Write-Restore circuit 128 both discharges/pre-charges the LBL 104 to ground during precharge and serves as the data write access path. Thus, where switching speed is not a concern, the number of cells per LBL can be increased in order to minimize array overhead and maximizes array density. Alternately, the designer may trade such array density for speed with more-dense or less-dense individualized segment switching/restore control, as further described herein below.

Figure 2A:
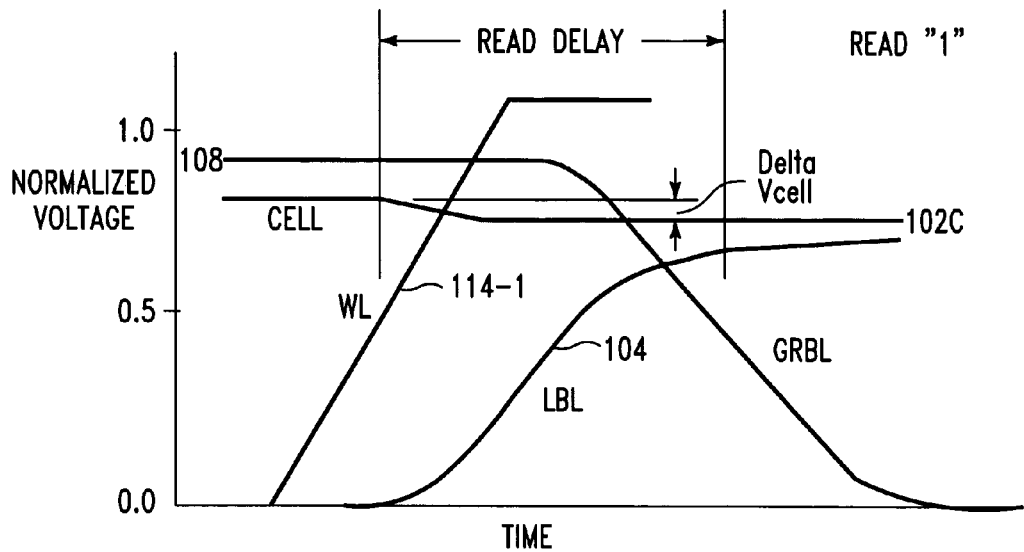
FIGS. 2A-B show timing diagram examples of reading data from a cell in a local bit line segment.
Figure 2B:
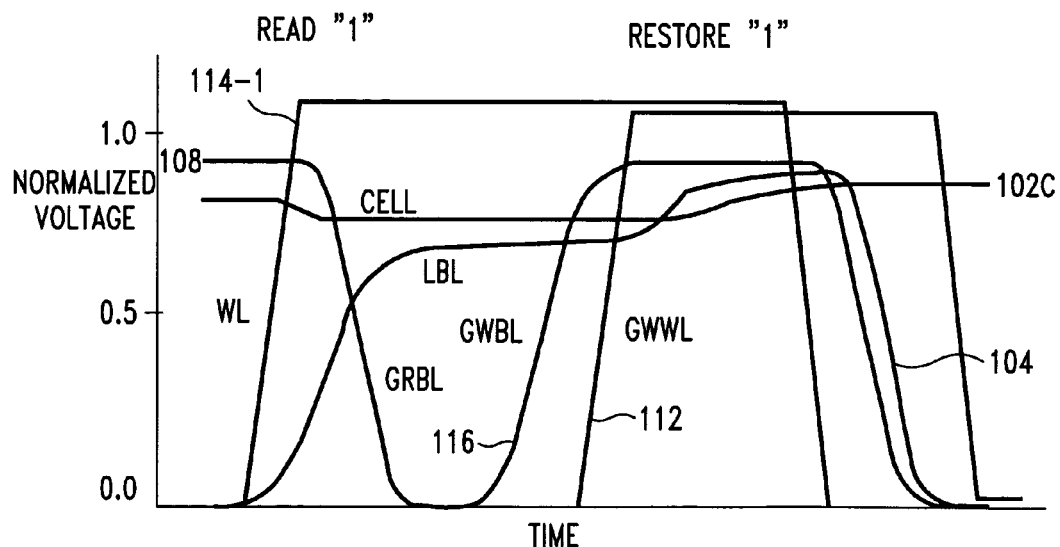

FIG. 2A show a timing diagram example of reading data from a cell (e.g., 102-1) and FIG. 2B shows a Read and Restore cycle in a local bit line segment, e.g., 100 of FIGS. 1A-B. The cell 102-1 storage capacitor $C_{CELL}$ 102C is charged, e.g., to $V_{dd}$, storing a logic one in this example. The local bit line 104 and correspondingly, local bit line capacitance $C_{LBL}$ 120 is discharged/pre-charged to ground. GRBL 108 is pre-charged high. Either immediately before, or simultaneously with driving the word line 114-1, both LBL 104 and GRBL 108 are floated. Then, the word line 114-1 is driven high (above $V_{dd}$) to select the cell 102-1 by turning on the respective cell pass gate 102W. With the pass gate 102W on, charge transfers from $C_{CELL}$ 102C to $C_{LBL}$ 120 as $V_{CCELL}$ dips slightly (Delta) and $V_{CLBL}$ rises, approaching $V_{CCELL}$, i.e., to $V_{dd}$-Delta.

Reading a "0" may introduce cell leakage that cause minor changes in the stored cell voltage, necessitating a subsequent restore. Similarly, reading a "1" disturbs cell voltages by a relatively small amount (i.e., corresponding to the charge that was transferred from the cell to the local bit line) that must be restored. Thus all Read accesses are followed by a Restore. Accordingly, because only a small portion of the charge must be replaced, a preferred embodiment DRAM restores much faster than an equivalent state of the art DRAM array, where the reading of a stored "1" completely depletes the cell charge so the entire charge needs replenishment. Thus, the preferred embodiment DRAM provides, comparatively, a very fast read access time, removing a very small amount of charge from the cell during the read for a much faster read-restore cycle time than is typically possible with a conventional complex DRAM sensing approach.

Read-Restore. There are various ways to achieve the Restore of data after a Read cycle. The Write/Restore circuit 128 of FIG. 1B shows one possible method while FIG. 5 described later, shows another. In all cases, the final sense signal obtained on GRBL must be inverted and applied to the GWBL which then passes the correct signal through the pass device 110 on to the LBL and still-selected storage cell. In FIG. 1B, this occurs as follows: the Write circuit 130 is inactive since signal 136 is high and signal 134 is low. Circuit 132 is activated by making signal 138C low and signal 138T high, which basically activates the inverter 132 including devices 132P and 132N. The sense signal appearing on GRBL 108 is inverted, amplified and appears on GWBL 116. The Write pass gate device 110 is turned on by GWWL signal 112, placing the correct sense signal on LBL 104 and into the storage cell which was just read and still selected by its word line WL 114 being held high. The word line is subsequently set low. The restore circuit 132 is set to the tristate by making signal 138C high and signal 138T low as described previously when there is a write operation, otherwise it remains in the inactive state.

Figure 3A:
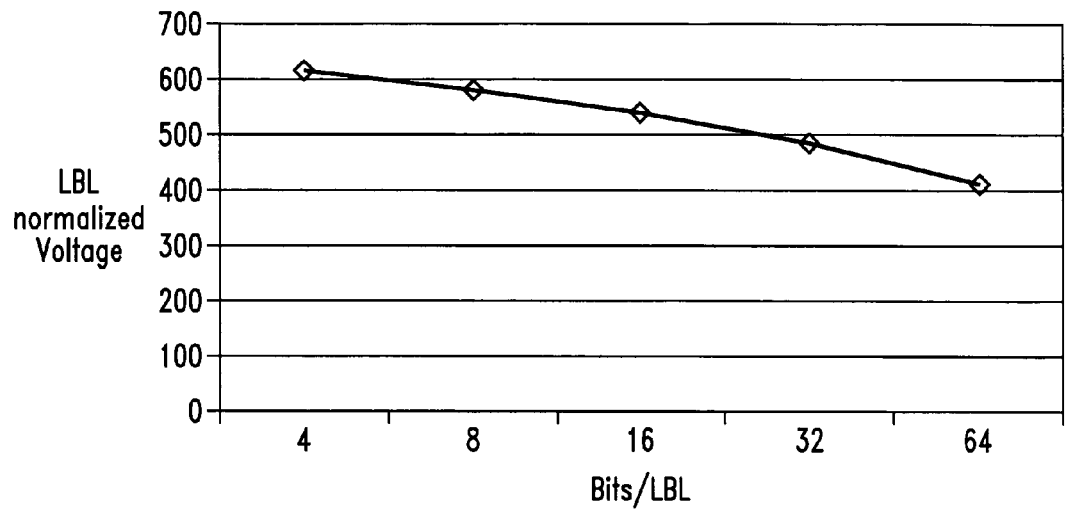
FIGS. 3A-B are examples comparing the number of cells on a local bit line with local bit line signal and, latency or sense delay.
Figure 3B:
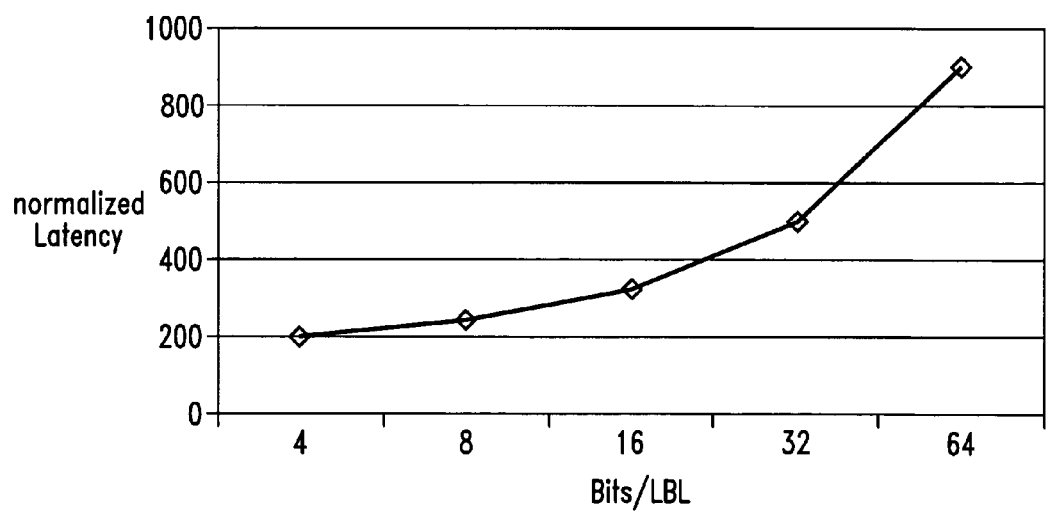

FIGS. 3A-B are examples showing how the number of cells selected to the local bit line affects local bit line signal and latency or sense delay, respectively. If a selected word line 104-1 is driven high enough (e.g., to $V_{dd}+V_T$) to allow all charge to transfer to the cell (to $V_{dd}$), then during a read the final local bit line voltage (at steady state) and the final storage capacitor voltage are $V_{CCELL}=V_{CLBL}=C_{CELL}*V_{dd}/(C_{CELL}+C_{LBL})$. So, for example, if $C_{CELL}$ is nine times as large as $C_{LBL}$, then the final local bit line voltage is $V_{CLBL}=0.9V_{dd}$. Additionally, as soon as $V_{CLBL}>V_T$, the sense/read device 106 turns on and switches GRBL 108, which was previously pre-charged high and then floated during the read. There is an optimal size for the sense/read device 106. If it too large, its gate capacitance will cause the LBL capacitance to increase to a point where it reduces the voltage transferred to the local bit line, LBL. If it is too small, it will increase the time it will take to discharge the GRBL during a read. As noted hereinabove, if the selected cell storage capacitor $C_{CELL}$ 102C is discharged, LBL 104 and GRBL 108 remain unchanged, at ground and high, respectively, after the word line 114-1 is driven high.

Figure 4:
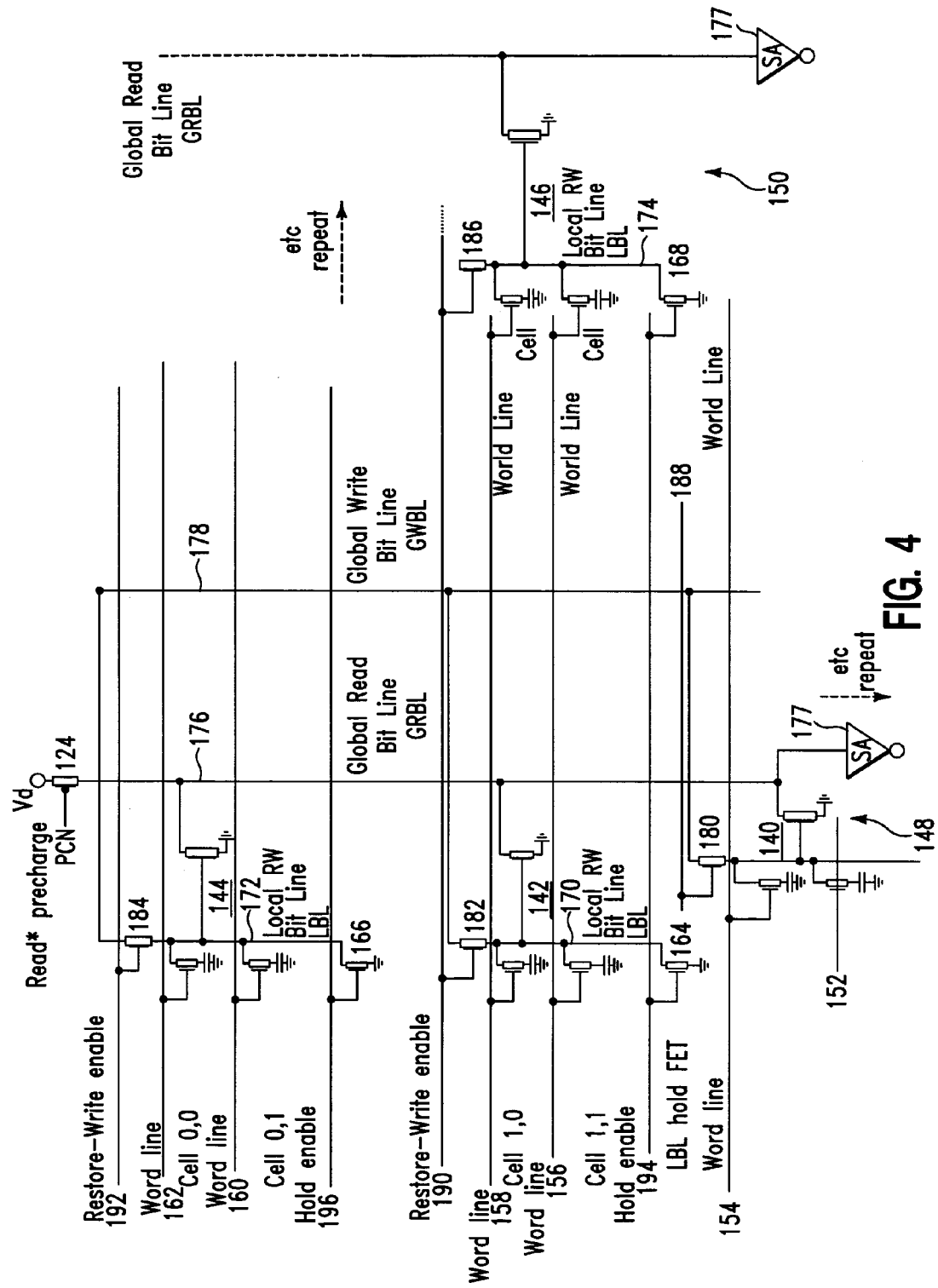
FIG. 4 shows a cross sectional example of a more complete array embodiment hierarchical data path DRAM, but without the Write/Restore circuits, 128 of FIG. 1B.

FIG. 4 shows an expanded cross sectional example of the multiple column segments 140, 142, 144, 146, each substantially identical to the segment 100 of FIG. 1A. (Write/Restore circuits not shown). Column segments 140, 142, 144 are 3 of N located in one column 148 and column segment 146 is one of N located in another column 150. Further, word lines 152, 154, 156, 158, 160 select individual cells in column segments, 140, 142, 144, 146 and shown in this example, word lines 156, 158 select corresponding cells in the same row of segments 142, 146. Further, each segment 140, 142, 144, 146 includes a clamp 164, 166, 168 that holds its respective local bit line 170, 172, 174 low between accesses or during an access of another segment of the same column 148, 150, i.e., the clamp 164, 166, 168 is active when none of the word lines is selected for that particular segment 142, 144, 146. Thus, during such an access the clamps 164, 166, 168 insure that the unselected segments' local bit lines 170, 172, 174 remain discharged/pre-charged to ground. As shown for column 148, each column 148, 150 includes a GRBL 176 and a GWBL 178 gated through write devices 180, 182, 184, 186 by a respective GWBL signal 188, 190, 192. In this example, write devices 180, 182, 184 and 186 are both write and restore devices with each segment 140, 142, 144, 146, operating substantially as described hereinabove.

Between accesses to a segment 140, 142, 146, clamps 164, 166, 168 will clamp LBLs 170, 172 174 low. All of the GWWL lines 188, 190, 192 are low and the write/restore devices 180, 182, 184, 186 are off. The respective GRBL 176 is precharged high, and the LBLs 170, 172, 174 are clamped low through clamp devices 164, 166, and 168 for improved noise shielding. Further, during an access, such as during a read, only one hold enable signal 194, 196 may be dropped low with one corresponding GWWL 188, 190, 192 high (e.g., 190). Thus, the clamp devices 164, 166, 168 maintain that initial quiescent low state in unselected segments, holding all but the selected LBL 170, 172, 174 at ground, even in the presence of significant device leakage, e.g., across the sense devices and etc. for additional noise protection. Thereafter, only the selected segment is restored to ground. So, instead of allowing unselected segments to float or be switched, unselected segments are clamped to ground with only selected segments being temporarily floated (initially during a read) and switched, i.e., when writing or sensing. Advantageously, with only a minimal additional impact to density (i.e., to add clamp devices 164, 166, 168) and slightly more complex control (to switch on and off the clamp devices 164, 166, 168 and the write/restore devices 180, 182, 184, 186), power is reduced in this preferred embodiment by not switching the unselected-segment.

Figure 5:
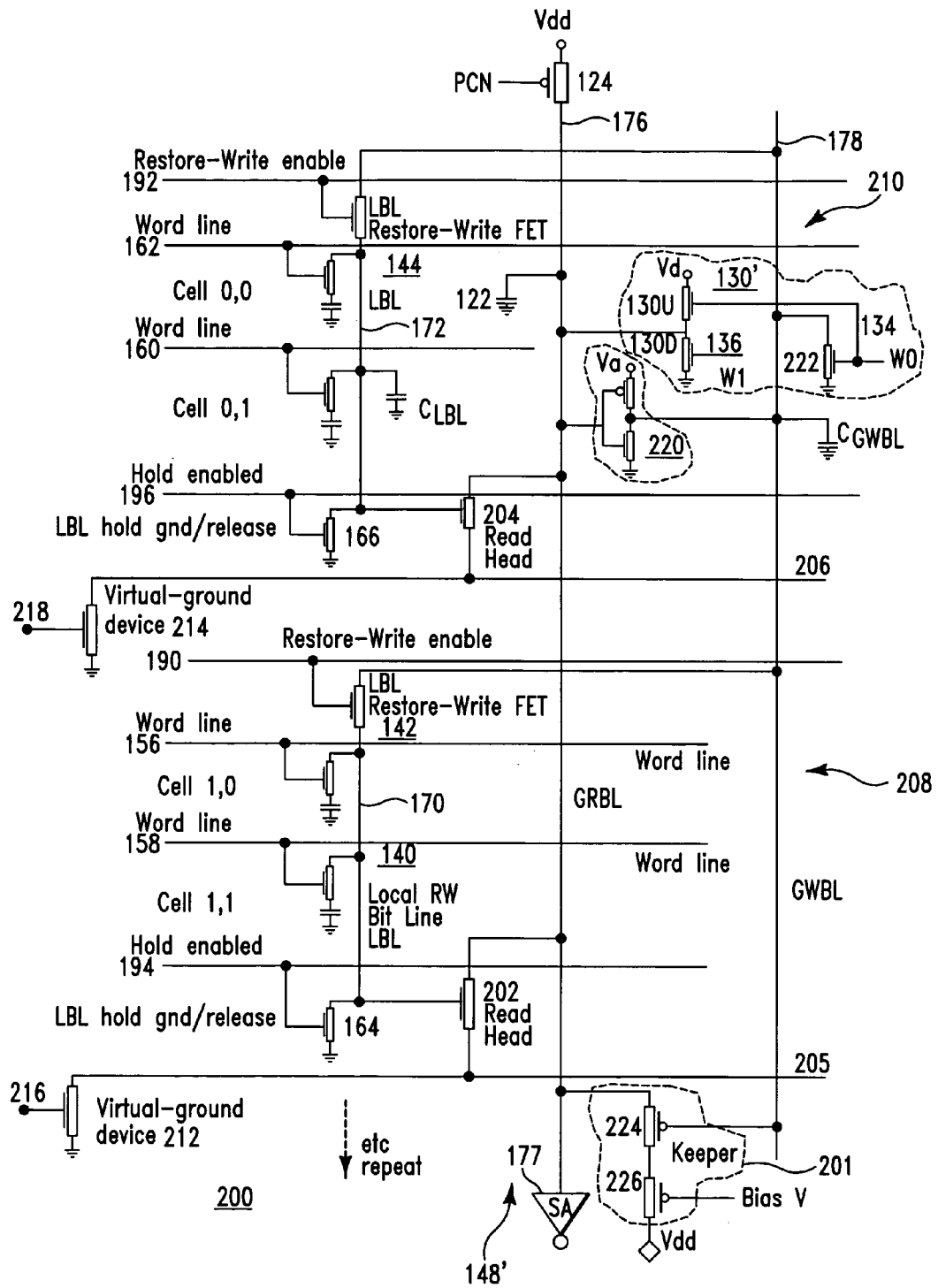
FIG. 5 shows an array structure using Read Heads with a controlled connection to ground and Keeper circuit to limit GRBL leakage during reading

FIG. 5 shows a cross sectional example 200 of a leakage tolerant preferred embodiment of a hierarchical path DRAM through a single column 148', substantially similar to the example of FIG. 4 with like features labeled identically. The preferred leakage tolerant embodiment 200 has application whenever leakage current effects (e.g. in the read device 106 in FIG. 1 and 204 in FIG. 5) on the global read bit line 176 become significant as DRAM technology scales into the deep submicron region.

For instance, if the leakage of the read devices 204 in FIG. 5 becomes large, reading a "0" which requires the GRBL to remain at a high, and preferably full precharge voltage, can encounter difficulties. The potential difficulty is that the several read head devices (e.g. 16 or more), connected to GRBL, could allow sufficient charge to leak through their sources to ground, thereby reducing the voltage on the GRBL such that it is sensed as a stored "1" rather than a "0". These read heads are typically but not necessarily small devices with low threshold voltages to improve the sensing and thus are prone to high leakage. This leakage can be minimized by the introduction of a virtual ground device, 214 in FIG. 5 which works as follows. The gate input signal 218 to all virtual ground devices will normally be low so all such devices are off, thus isolating the source of all read head devices such as 204 from ground. Thus the leakage to ground is reduced by these typically larger and higher threshold isolation devices. Since there are many fewer such devices shared over many read head devices, and they can be placed in the peripheral region, they do not have a significant impact on array density. An isolation device 214 can be used for a large number of read heads in a row across the array such as 204 as shown in FIG. 5. The exact number will be technology and design dependent, but in any case, allows use of a more optimum read device while minimizing signal degradation due to leakage.

FIG. 5 additionally shows a keeper-circuit 201 for leakage compensation. Even though the virtual ground, isolation devices 214 can substantially reduce one component of GRBL leakage, there are other leakages paths which can produce sensing problems. For instance gate to source or drain leakage components: numerous other devices connected to the GRBL as can be seen in FIG. 5. This leakage can be compensated by the use of a circuit which replenishes the leaked charge, and does so only when the GRBL is precharged high. This is accomplished by use of two pFET devices, 224 and 226, in FIG. 5. These 2 devices are in series, connecting Vdd to GRBL through a high resistance which varies with the amount of voltage on GRBL. Device 226 is always slightly on as determined by the gate bias voltage, BiasV. If GRBL is precharged high, GWBL will be low as set by inverter 220. This will cause PFET device 224 to conduct and in combination with device 226, will replenish any lost charge on GRBL. When GRBL is at 0 volts, GWBL will be at a high voltage which holds device 224 at a high resistance, thus cutting off the charge flow to GRBL. Note that any replenished charge can never cause the voltage to exceed the ideal precharged voltage, Vdd on GRBL. Furthermore, since these devices 224 and 226 are much smaller and weaker than the devices in the Restore circuit 220, and Write circuit 130', they have little effect on the dynamic behavior of reading, restoring and writing functions i.e. they only help maintain the desired static, initial state for reading. The amount of current (charge) provided by the keeper can be controlled and varied in many ways. For instance, the BiasV can be an externally supplied voltage determined after initial testing to determine the actual leakage in a specific technology or even on individual chips. Additionally, multiple such BiasV can be supplied to various parts of the chip to allow for variations within a chip. Also, a small PFET device, 226 with BiasV tied to ground in series with an appropriately designed device, 224, can be an effective charge keeper.

Writing Circuit of FIG. 5: In principle, the Restore and data-Write functions of FIG. 5 are very similar to those in FIG. 1B except the restore circuit does not include a tristate circuit, and the write inverter of FIG. 1B is now two NFET's in series and has its output connected to the GRBL with a separate NFET connected to GWBL. So the Restore portion of the new Write/Restore circuit has 2 fewer FET's (tristate eliminated) but 1 additional FET in the Write circuit for a net area improvement of 1 less FET.

The data Restore function works similar to that in FIG. 1B, described previously, as if the tristate devices 132PE and 132NE are always on. In FIG. 5, during Read-Restore, the write signals W0 134 and W1 136 are both low so all three devices, 130U, 130D and 222 are off (high impedance) and the signal on GRBL is inverted, amplified and placed on GWBL as previously. To write a "1" (high voltage) into a selected cell, W0 134 is low, holding devices 130U and 222 off, while W1 136 is on which turns on device 130D and pulls GRBL to ground. This signal is input to the inverter 220, which produces a high output on GWBL as needed to write a 1 into the selected cell, as before. To write 0 volts into a cell on the selected segment, signal W0 134 is high which turns on NFET devices 130U and 222, while W1 136 is maintained low, holding NFET 130D in a high impedance state. Device 222 pulls GWBL to 0 at the same time that device 130U pulls GRBL high. These two states reinforce each other. If a "1" signal was being simultaneously Read from the same cell to which we are writing a 0, the corresponding Read Head, 204, would attempt to pull GRBL low and GWBL high. However, the combination of devices 130U and 222 would overpower this read device since it is small and weak by comparison. An analogous and exactly opposite situation exists if a "0" signal is being read from the cell to which we are attempting to write a "1"—the read head 204 would be off, leaving GRBL high but device 130D would pull GRBL to ground as necessary. This provides another unique and inherent feature in this circuit, namely, if the writing of the cell is delayed slightly in time, the correct, current data in the selected cell can be READ, the sense amp 177 set, and with the same cell still selected, new data, 0 or 1, can subsequently be written. This is a unique feature not typically present in state of the art DRAMs, and especially in DRAM using a differential sensing method, namely the correct data can be read from a cell, and new data written without requiring an additional slow, reset or pre-charge cycle.

Thus, advantageously a preferred embodiment segmented bit line DRAM has significantly improved performance with a very simple self-timed sense and self restore. Further, because the preferred embodiment segmented bit line DRAM data path is self timed and extremely fast, it may be used in memory applications not typically considered suited for DRAMs. Since the Read "1" signal of the local bit line is almost a full logic level this self-timed sensing is much simpler than a typical very complex cross-coupled differential sense amplifier used in state of the art DRAMS. Additionally, the sharing of read and write devices among the cells on a local bit line results in very little array area impact, which may be offset by eliminating overhead normally required for more complicated, complementary, cross-coupled precisely-timed sense amplifiers and associated timing. Thus, the present invention provides memory and logic designers with a dense, fast, low-power, reliable memory option.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A DRAM array comprising:
   a plurality of rows of DRAM cells, each of said rows being selected by a word line; and
   a plurality of columns of said DRAM cells, each of said columns comprising:
      a plurality of column segments, each of said column segments including DRAM cells in two or more of said plurality of rows connected to a local bit line and a clamp device selectively gated by a hold enable and connected at a conduction terminal to said local bit line, said clamp device being gated off when one of said DRAM cells is selected, and
      a global bit line, contents on each said local bit line being coupled to said global bit line, wherein said global bit line is a global read bit line, each of said columns further includes a global write bit line, and each of said column segments further comprises a write device gated by a write select line and connected between said global write bit line and said local bit line.

2. A DRAM as in claim 1, further comprising a write/restore circuit, said global read bit line connected to an input of said write/restore circuit and an output of said write/restore circuit driving said global write bit line.

3. A CMOS DRAM macro comprising:
   a local bit line;
   at least two and less than 65 DRAM cells connected to said local bit line;
   a clamp device selectively gated by a hold enable and connected at a conduction terminal to said local bit line, said clamp device being gated off when one of said at least two DRAM cells is selected;
   a read device gated by said local bit line;
   a global read bit line connected to a conduction terminal of said read device;
   a global write bit line; and
   a write device gated by a write select line connected between said global write bit line and said local bit line.

4. A CMOS DRAM as in claim 3, said global read bit line further comprising a pair of series connected PFETs connected between a supply line and said global read bit line one of said pair being gated by said global write bit line.

5. A CMOS DRAM as in claim 4, wherein a second of said pair is gated by a reference voltage, said reference voltage being between a supply voltage on said supply line and ground.

6. A CMOS DRAM as in claim 3, further comprising:
   an inverter driven by said global read bit line and driving said global write bit line;
   a write driver driving said global read bit line; and
   a write device driving said global write bit line.

7. A CMOS DRAM as in claim 3, wherein said clamp device is connected between said local bit line and a supply line.

8. A CMOS DRAM as in claim 3, wherein each of said read device, said write device and said clamp device are NFETs.

9. A CMOS DRAM as in claim 8, further comprising a write/restore circuit, said global read bit line connected to an input of said write/restore circuit and an output of said write/restore circuit driving said global write bit line.

10. A CMOS DRAM as in claim 9, wherein said write/restore circuit comprises:
    a write driver, each of a pair of data write signals selectively driving said write driver; and
    a restore circuit, an output of said restore circuit connected to an output of said write driver, said global read bit line connected to an input of said restore circuit, said restore circuit being selectively enabled by a complementary restore enable pair.

11. A CMOS logic chip including an embedded DRAM array, said embedded DRAM array comprising:
    a plurality of rows of DRAM cells, each of said rows being selected by a word line;
    a plurality of columns of said DRAM cells, each of said columns including a plurality of column segments, each of said column segments comprising:
       a local bit line, at least two and less than 65 DRAM cells connected to said local bit line,
       a clamp device selectively gated by a hold enable and connected at a conduction terminal to said local bit line, said clamp device being gated off when one of said at least two DRAM cells is selected, and
       a read device gated by said local bit line; and
    a global read bit line in each column, read devices in said column segments in said each column being connected at a conduction terminal to said global read bit line, wherein each of said column segments includes a write device gated by a write select line, and said CMOS logic chip further comprising a global write bit line in said each column, write devices in said column segments in said each column being connected between said global write bit line and said local bit line.

12. A CMOS logic chip as in claim 11, wherein each said clamp device is connected between said local bit line and a supply line.

13. A CMOS logic chip as in claim 11, wherein each of said read device, said write device and said clamp device are NFETs.

14. A CMOS logic chip as in claim 13, further comprising a write/restore circuit at said each column, said global read bit line connected to an input of said write/restore circuit and an output of said write/restore circuit driving said global write bit line.

15. A CMOS logic chip as in claim 13, wherein each said read device is connected between said local bit line and a virtual ground.

16. A CMOS logic chip as in claim 15, further comprising a virtual ground device connected between each said virtual ground and ground, said virtual ground device selectively connecting said each virtual ground to ground.

17. A CMOS logic chip as in claim 15, said global read bit line further comprising a pair of series connected PFETs connected between a supply line and said global read bit line one of said pair being gated by said global write bit line.

18. A CMOS logic chip as in claim 17, wherein a second of said pair is gated by a reference voltage, said reference voltage being between a supply voltage on said supply line and ground.

19. A CMOS logic chip as in claim 15, further comprising:
an inverter driven by said global read bit line and driving said global write bit line;
a write driver driving said global read bit line; and
a write device driving said global write bit line.

* * * * *